United States Patent
Zhang

(10) Patent No.: US 6,226,777 B1
(45) Date of Patent: May 1, 2001

(54) METHOD AND SYSTEM FOR IMPROVING THE PERFORMANCE OF A CIRCUIT DESIGN VERIFICATION TOOL

(75) Inventor: Chenmin Zhang, Ft. Collins, CO (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 09/199,712

(22) Filed: Nov. 25, 1998

(51) Int. Cl.[7] ........................................ G06F 17/50
(52) U.S. Cl. ............................ 716/5; 716/18; 716/3
(58) Field of Search ............................ 716/1–21

(56) References Cited

U.S. PATENT DOCUMENTS

| | | | |
|---|---|---|---|
| 5,426,591 | * 6/1995 | Ginetti et al. | 716/6 |
| 5,754,826 | * 5/1998 | Gamal et al. | 703/14 |
| 5,764,525 | * 6/1998 | Mahmood et al. | 716/18 |
| 5,812,416 | * 9/1998 | Gupte et al. | 716/2 |
| 5,867,396 | * 2/1999 | Parlour | 716/18 |
| 5,933,356 | * 8/1999 | Rostoker et al. | 703/15 |
| 5,953,236 | * 9/1999 | Hossain et al. | 716/6 |
| 6,026,228 | * 2/2000 | Imai et al. | 716/18 |
| 6,056,784 | * 5/2000 | Stanion | 716/5 |
| 6,163,876 | * 12/2000 | Ashar et al. | 716/5 |

FOREIGN PATENT DOCUMENTS

402257339 * 10/1990 (JP) ................................ G06F/11/26

OTHER PUBLICATIONS

Alessi et al. ("Integrating logic synthesis into a full chip ASIC design system", Proceedings of Second Annual IEEE ASIC Seminar and Exhibit, 1989, Sep. 25, 1989, pp. P2-2/1-4), Sep. 1989.*

Hsu et al. ("Digital design from concept to prototype in hours", 1994 IEEE Asia–Pacific Conference on Circuits and Systems, Dec. 5, 1994, pp. 175–181), Dec. 1994.*

Dettmer ("Logic synthesis—a faster route to silicon", IEE Review, vol. 35, No. 11, Dec. 7, 1989, pp. 427–430), Dec. 1989.*

* cited by examiner

Primary Examiner—Matthew Smith
Assistant Examiner—Phallaka Kik

(57) ABSTRACT

An improved integrated circuit design tool allows the incorporation of minor revisions to a high level register transfer language (RTL) code (netlist) by incorporating within a formal verification tool an engineering change order (ECO) compiler. The addition of the ECO compiler to the formal verification tool eliminates the need to rerun a synthesis tool after minor changes to a revised RTL netlist in order to generate a revised gate (logic) level netlist.

7 Claims, 5 Drawing Sheets

METHOD AND SYSTEM FOR IMPROVING THE PERFORMANCE OF A CIRCUIT DESIGN VERIFICATION TOOL

TECHNICAL FIELD

The present invention relates generally to verification tools used for circuit design, and more particularly, to a method and system for improving the performance of a circuit design verification tool by extending a formal verification tool to perform an engineering change order (ECO) compile operation.

BACKGROUND OF THE INVENTION

Modem electronic circuit design in general, and application specific integrated circuit (ASIC) design in particular, typically begins with a circuit designer writing a high level code that represents the desired functionality of the circuitry. This high level code is typically written in a programming language such as VERILOG® (VERILOG® is a registered trademark of Cadence Design System Corp.), VHDL, (very high speed integrated circuit hardware description language), or C language. After the design has been through several iterations and exhibits a degree of stability, the high level description language code can be converted to logic level, which uses gate level logic such as NAND gates and NOR gates etc., to implement the desired functionality described in the aforementioned high level code. The tool that performs this conversion is known as a synthesis tool. Several available synthesis tools can perform this conversion. For example, a software package available from SynOpSys Inc., of 700 East Middlefield Road, Mountain View, Calif., can perform the conversion from high level code to logic level code. As is known to those skilled in the art, the high level code is referred to as register transfer language (RTL) netlist and the logic level code is known as the gate level netlist.

Once the high level code is converted to gate level code, the designer will typically perform additional testing via simulation and formal verification in order to verify that the logic level code is an accurate representation of the high level code. If the logic level code is successfully verified, the logic level code is converted to a detailed layout of the circuit and the circuit is fabricated.

Typically, a formal verification tool in the form of a software product, available from, for example, Chrysalis Symbolic Design, Inc., of 101 Billerica Avenue, North Billerica Mass. is used to compare the high level code (RTL netlist) to the logic level code (gate level netlist) to determine whether they are equivalent. Typically, the RTL netlist is compared to the gate level netlist.

Sometimes during the verification operation, the high level code is changed to implement design changes or revisions. If the change is significant (e.g., a full metal mask change), another gate level netlist is typically generated and another round of verification testing is performed to compare the revised high level code to the revised gate level code.

If a required change to the high level code is minor (e.g., a simple metal mask change) a simplified compiler operation may be performed, thus reducing cost and minimizing production delay. An ECO (engineering change order) compiler is available from for example, SynOpSys Inc. in the form of an ECO compiler. Unfortunately, the cost of the ECO complier is approximately the same as the cost of performing the original formal verification. This indicates that even for a small revision in the high level code, a designer must perform the compile operation and then perform the design verification operation, each operation adding cost and production delay. A shortcoming with this process is that the circuit designer must determine the gate level change corresponding to the high level code change using different and often incompatible tools, or do it purely manually, which is highly error prone. The designer must then perform the verification operation again to verify the equivalency of the revised gate level netlist to the revised RTL netlist.

Unfortunately, the above mentioned verification operation cannot determine the change required to the first gate level netlist to make it match the revised RTL netlist. This predicament requires that the circuit designer switch between the synthesis tool and the verification tool.

Thus, a heretofore unaddressed need exists in the industry to address the aforementioned deficiencies and inadequacies.

SUMMARY OF THE INVENTION

The present invention provides a method and system for extending the application of a circuit design formal verification tool to add the functionality of a circuit design synthesis tool.

Briefly described, in architecture, the system can be implemented as follows. The system comprises a first high level circuit design program code (first RTL netlist) and a first logic level circuit design code (first gate netlist). Also included is a tool for comparing the first high level circuit design program code to the first logic level circuit design code in order to determine whether the first logic level circuit design code is an accurate representation of the first high level circuit design program code. If a problem with the first high level circuit design program code is discovered, then the first high level circuit design program code is revised. Also included is a compiler for compiling the revised high level circuit design program code in order to develop a revised logic level circuit design code.

The present invention can also be viewed as providing a method for improving a circuit design verification tool by integrating the operations of design comparison and design revision. In this regard, the method can be broadly summarized by the following steps: generating a first high level circuit design program code (first RTL netlist), generating a first logic level circuit design code (first gate netlist), comparing the first high level circuit design program code to the first logic level circuit design code in order to determine whether the first logic level circuit design code is an accurate representation of the first high level circuit design program code, and compiling a revised high level circuit design program code in order to develop a revised logic level circuit design code.

The present invention has numerous advantages, a few of which are delineated hereafter as merely examples.

An advantage of the invention is that it extends the usefulness of a circuit design formal verification tool.

Another advantage of the present invention is that it eliminates the need for a circuit designer to use multiple tools in order to implement changes to the design.

Another advantage of the invention is that it is simple in design, user friendly, robust, reliable, and efficient in operation, and easily implemented for mass commercial production.

Another advantage of the invention is that it adds the functionality of a compiler to a formal verification tool.

Other features and advantages of the present invention will become apparent to one with skill in the art upon examination of the following drawings and detailed description. It is intended that all such additional features and advantages be included herein within the scope of the present invention.

BRIEF DESCRIPTION OF THE SEVERAL VIEWS OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE INVENTION

The method and system for improving the performance of a circuit design verification tool of the present invention can be implemented in hardware, software, firmware, or a combination thereof. In the preferred embodiment(s), the method and system for improving the performance of a circuit design verification tool is implemented in software that is stored in a memory and that is executed by a suitable instruction execution system.

Figure 1:
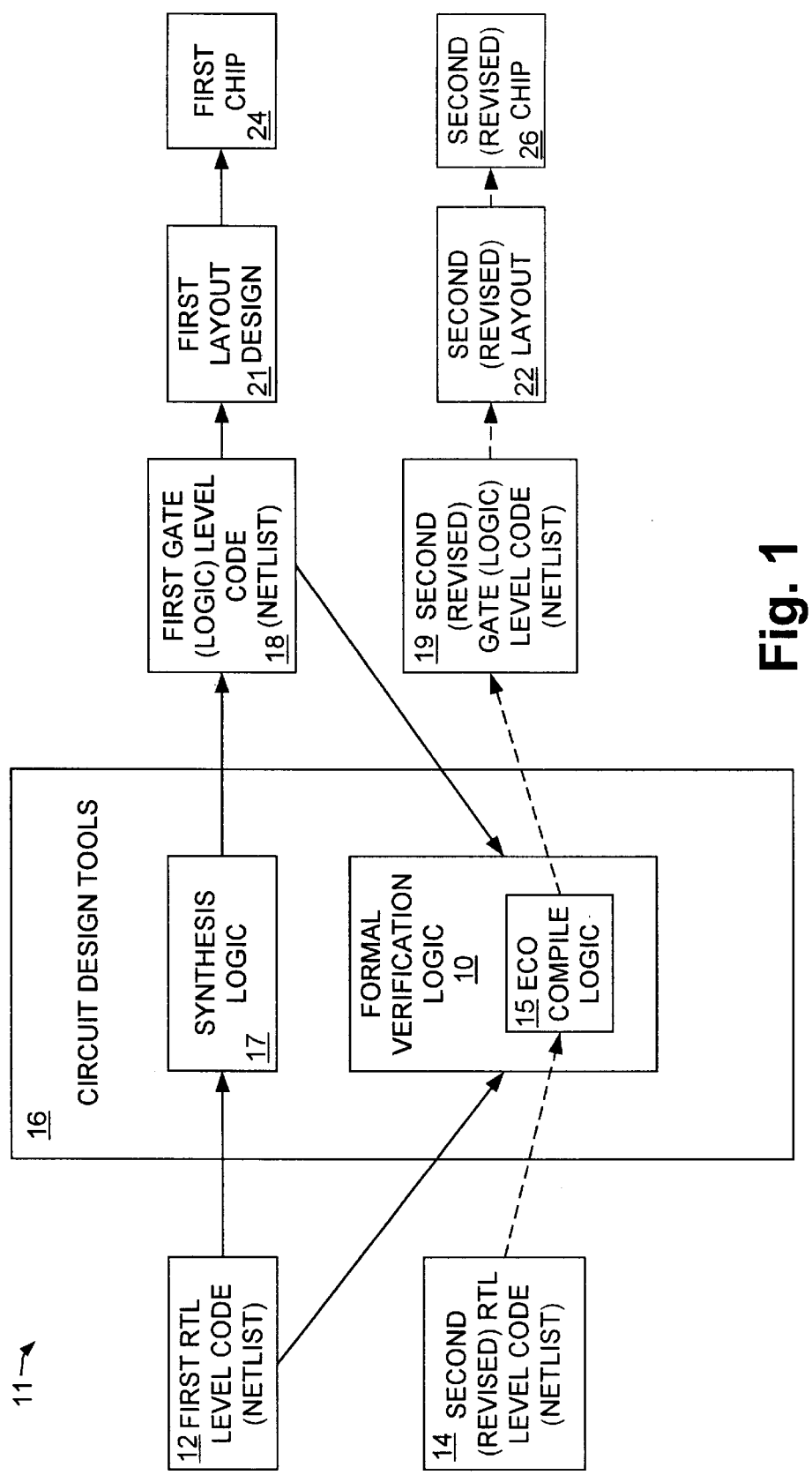
FIG. 1 is a schematic view illustrating a preferred embodiment for implementing the improved circuit design verification tool of the present invention.
Figure 2A:
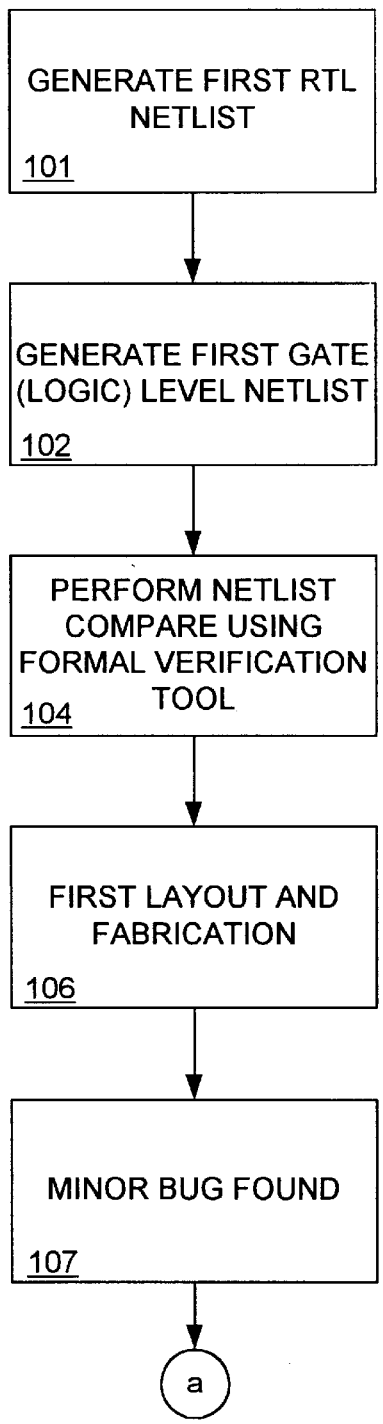
FIGS. 2A and 2B collectively are a flow diagram illustrating the operation of the method for improving a circuit design verification tool of the present invention.
Figure 2B:
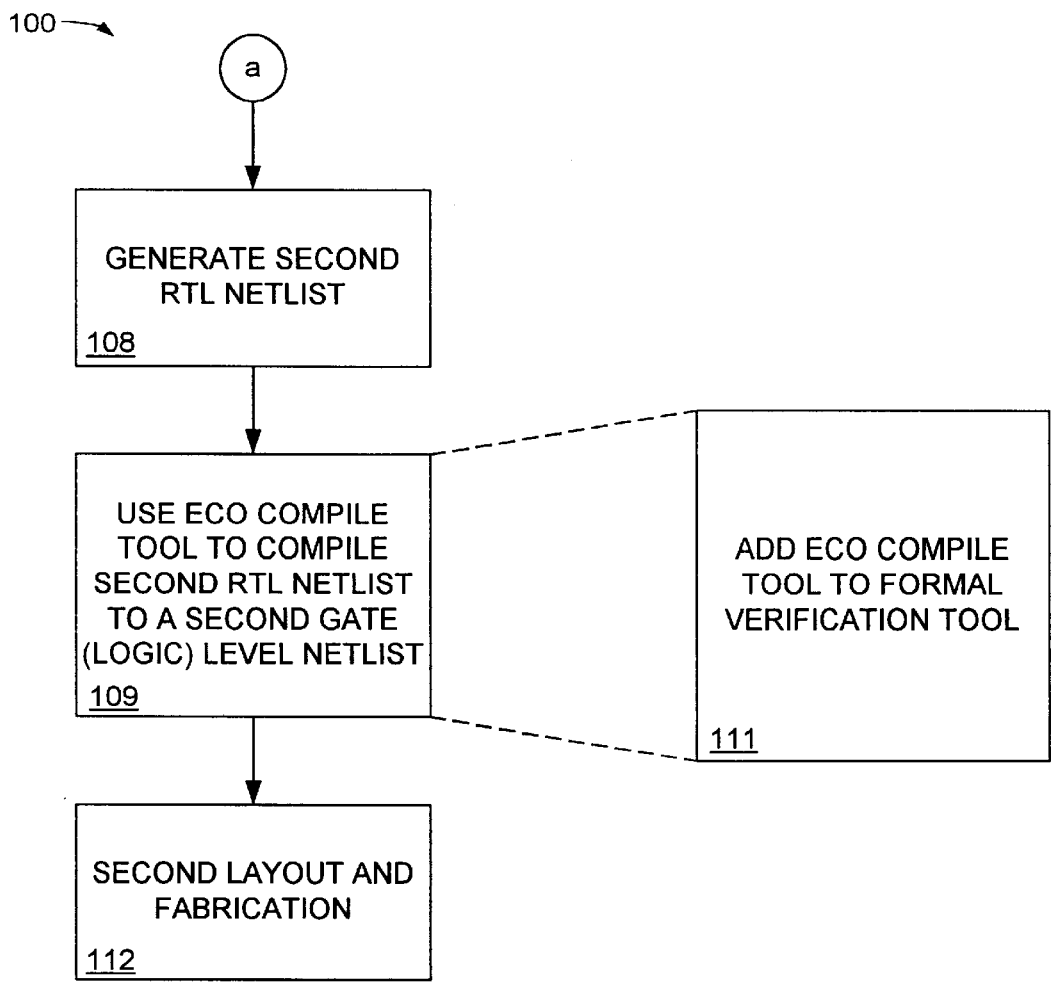

Before discussing the block diagram of FIG. 1, it is noted that the flow chart of FIGS. 2A and 2B illustrate the functionality and operation of a possible implementation of the method for improving the performance of a circuit design verification tool. In this regard, each block represents a module, segment, or portion of code, which comprises one or more executable instructions for implementing the specified logical function(s). It should also be noted that in some alternative implementations, the functions noted in the blocks may occur out of the order noted in FIGS. 2A and 2B. For example, two blocks shown in succession in FIGS. 2A and 2B may in fact be executed substantially concurrently or the blocks may sometimes be executed in the reverse order, depending upon the functionality involved, as will be further clarified hereinbelow.

The method for improving the performance of a circuit design verification tool program, which comprises an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (magnetic), a read-only memory (ROM) (magnetic), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

It should be noted that in the discussion to follow, some elements and operations of integrated circuit design are omitted for clarity, with only the element and steps relevant to the description of the present invention presented herein.

FIG. 1 is a schematic view illustrating a preferred embodiment for implementing the improved circuit design verification tool of the present invention. An integrated circuit design will typically pass through several iterations before the designer feels that a working prototype has been achieved. At that time, the circuit designer will develop the circuit design into high level language, such as register transfer language (RTL) code 12. RTL level code 12 represents a high level circuit design, which is then formulated into what is known in the industry as a netlist, or RTL netlist. The RTL netlist is a high level representation of the circuit design. First RTL level netlist 12 is then operated upon by synthesis logic 17 in order to develop a gate, or logic, level implementation of the high level RTL code 12. This gate level code results in a first gate level netlist 18, which uses NAND gates, NOR gates, etc., to implement the desired functionality that was originally described in the high level code.

Once the first gate level netlist 18 is developed, it is necessary to verify that the first gate level netlist 18 is an accurate representation of the first RTL level netlist 12. Formal verification logic 10 compares the first RTL level netlist 12 to the first gate level netlist 18 to verify the synthesis. Once it is verified that the first gate level netlist 18 is an accurate representation of the first RTL level netlist 12, first layout design 21 is created, from which a first device, or chip, 24 is fabricated. First chip 24 is illustratively an application specific integrated circuit (ASIC) chip.

Typically, during the normal fabrication and testing process, circuit anomalies known as "bugs" are discovered. Major bugs typically require extensive alterations to the circuit mask. The circuit mask is the overall pattern from which the circuit is fabricated. Minor changes however, may be implemented by making minor changes to the metal mask, i.e., those changes do not require an extensive change to the mask.

Major changes to the mask will typically require the designer to develop a second, or revised, RTL netlist, convert the revised RTL netlist to a gate level netlist and then perform another formal verification in which the revised gate level netlist is compared to the revised RTL netlist.

Minor changes to the mask however, while possibly not requiring a complete revision to the RTL netlist and the corresponding revision to the gate level netlist and required formal verification, may still require at least another compile operation.

Illustratively, a second RTL level netlist 14 is developed, which addresses and corrects bugs found in the first chip 24. Second RTL level netlist 14 is then operated upon by engineering change order (ECO) compile logic 15, which resides within formal verification logic 10, in order to determine and implement the changes required to the first RTL level netlist 12 so that the second (revised) gate level netlist 19 may be developed, which is an accurate representation of the second RTL level netlist 14.

The compile operation is performed by ECO compile logic 15 in circumstances where a minor change to the metal mask requires a revision to the first RTL level netlist 12. The revised RTL level netlist 14 is compiled to a second gate level netlist 19, which reflects the RTL level netlist changes. By performing the ECO compile logic function within the formal verification logic two major drawbacks may be substantially eliminated. First, a separate ECO compile operation is very costly. In fact, the ECO compiler operation in some cases may be as costly to perform as the formal verification tool. Second, the formal verification tool does not illustrate the changes required to the first gate level netlist in order to correspond to the revised RTL level netlist. This requires a designer to switch between a synthesis tool (to go from the RTL level netlist to the gate level netlist) and a formal verification tool (to verify that the revised RTL level netlist corresponds to a revised gate level netlist).

Significant time and resource savings are possible by adding the ECO compile logic to the formal verification logic. In circumstances where the ECO compile logic will be performed, typically only a limited number of gates of the first gate level netlist will be changed in order to correspond to the second (revised) RTL level netlist. Because the formal verification logic 10 already possesses sufficient information regarding the first RTL level netlist 12, first gate level netlist 18, and the second (revised) RTL level netlist 14, it is possible to determine the changes required to the second (revised) gate level netlist 19 so that it corresponds to the second (revised) RTL level netlist 14.

The second (revised) layout 22 is generated from the second gate level netlist 19 and the second (revised) chip 26 may be fabricated.

FIGS. 2A and 2B collectively are a flow diagram illustrating the operation of the method for improving the performance of a circuit design verification tool of the present invention.

Illustratively, in block 101 an application specific integrated circuit (ASIC) design is written in a high level code, such as VERILOG®, VHDL, or C language, from which is generated a first register transfer language (RTL) netlist. An RTL netlist is a high level description of the particular design.

In block 102, after the high level design is deemed sufficiently stable, the high level description language is converted to gate, or logic, level. The result is a gate level netlist, which uses NAND gates, NOR gates, etc., to implement the functionality that was originally described in the high level code. This conversion is performed using what is known in the industry as a synthesis tool. A synthesis tool can be, for example, a tool supplied by SynOpSys, Inc. This synthesis tool essentially takes the RTL leveinetlist and generates a corresponding gate level netlist. After the conversion to a gate level netlist, the gate level netlist can be compared to the original RTL level netlist in order to determine whether the gate level netlist is an accurate implementation, or representation of the RTL level netlist.

In block 104, the gate level netlist is compared to the RTL level netlist using a formal verification tool. A formal verification tool is available from, for example, Chrysalis Symbolic Design, Inc., and is used to determine whether the gate level netlist accurately represents the RTL level netlist. If the gate level netlist accurately matches the RTL level netlist, then in block 106, the gate level netlist is converted to a layout level and fabricated into a device as known by those skilled in the art. The ASIC designer now has a "chip" with which the circuit design may be further verified and tested.

Typically, during the normal fabrication and testing process, circuit anomalies known as "bugs" are discovered. Major bugs typically require extensive alterations to the circuit mask. The circuit mask is the overall pattern from which the circuit is fabricated. Minor changes however, may be implemented by making minor changes to the metal mask, i.e., those changes that do not require an extensive change to the mask.

Major changes to the mask will typically require the designer to develop a revised RTL netlist (block 108), convert the revised RTL netlist to a gate level netlist and then perform another formal verification in which the revised gate level netlist is compared to the revised RTL netlist.

Minor changes to the mask however, while possibly not requiring a complete revision to the RTL netlist and the corresponding revision to the gate level netlist and required formal verification, may still require at least another compile operation.

This compile operation is illustrated in block 109 where an engineering change order (ECO) compile is performed. The ECO compile operation is useful where a minor change to the metal mask requires a revision to the RTL level netlist. The revised RTL level netlist is compiled to a gate level netlist, which reflects the RTL level netlist changes. A major drawback to the ECO compile operation is that it is very costly. In fact, the ECO compiler operation in some cases may be as costly to perform as the formal verification tool. The formal verification tool however, has drawbacks as well. For example, the formal verification tool does not illustrate the changes required to the first gate level netlist in order to correspond to the revised RTL level netlist. This requires a designer to switch between a synthesis tool (to go from RTL level netlist to gate level netlist) and a formal verification tool (to verify that the revised RTL level netlist corresponds to a revised gate level netlist), which consumes valuable time and resources.

In block 111, the present invention illustrates the time and resource savings possible by adding the ECO compile operation to the formal verification tool. In circumstances where the ECO compile operation will be performed, typically only a limited number of gates of the first gate level netlist will be changed in order to correspond to the second (revised) RTL level netlist. Because the formal verification tool already possesses sufficient information regarding the first RTL level netlist, first gate level netlist, and the second (revised) RTL level netlist, it is possible to determine the changes required to the second (revised) gate level netlist so that it corresponds to the second (revised) RTL level netlist.

In block 112, the second gate level netlist is laid out and the layout is fabricated into a chip. Shown in Appendix A is an illustration of the results obtained using the method and system for improving the performance of a circuit design verification tool of the present invention. Although the following example was generated manually, the concept of the present invention will lend itself gracefully to implementation via software.

In order to illustrate the results obtainable through the operation of the present invention, attached hereto as Appendix A are the following files: patent_org (original RTL netlist), sm_mem_pen (original gate netlist), patent_eco (revised RTL netlist), and eco_gates (revised gate netlist), which, along with the description that follows, will be used to illustrate the operation of the present invention.

In the patent_org file, the original design illustrated is a very simple state machine, which is written in RTL. There are four states, which are TX_IDLE, TX_EOP, TX_BYTE2, and TX_BYTE3. These four states are assigned 4'h0, 4'h1, 4'h2 and 4'h3 respectively, by the parameter definition at the top of the file. In this RTL design, when tx state is equal to 2'b00, tx_req=1'b0 and sm_tx_eop=1'b0 are being executed. When tx_state=2'b01, sm_tx_eop=1'b1 and tx_req=1'b0 etc., are being executed.

In this original design, sm_tx_eop is true (logic 1) only when: 1) the design is in TX_EOP state (tx_state=01) or 2) the design is in TX_BYTE2 state (tx_state=10) AND (tx_cnt_eq1=1). The signal tx_cnt_eq1 is assigned to logic 1 when txcount[9:0]=10'h001, which means that all txcount bits except bit 0 are at logic level 0.

This RTL file is synthesized to a gate level implementation, which is shown in Appendix A as the resultant gate level netlist file sm_mem_pen. The synthesis tool traditionally will attempt to optimize the logic to reduce the required gate count to implement the desired functionality dictated by the RTL design. Only input/output ports and register names will be kept, most of the internal signal names will be optimized away.

At this point the gate level netlist will be used to generate the device layout drawings so that a device can be fabricated. In this example, one bug was discovered in the chip upon testing. In order to correct the bug, the TX_BYTE3 state was revised from executing sm_tx_eop=1'b0 to execute sm_tx_eop=tx_cnt_eq1.

As stated above, the synthesis tool will attempt to optimize the logic to reduce the required gate count to implement the desired functionality dictated by the RTL design. Only input/output ports and register names will be kept, most of the internal signal names will be optimized away. This makes reading the gate level description very difficult.

The present invention makes possible a tool which can take the RTL change (see Appendix A, file patent_eco for revised RTL netlist) and automatically change the original gate level netlist (see Appendix A, file sm_mem_pen) to match the revised RTL.

Figure 3A:
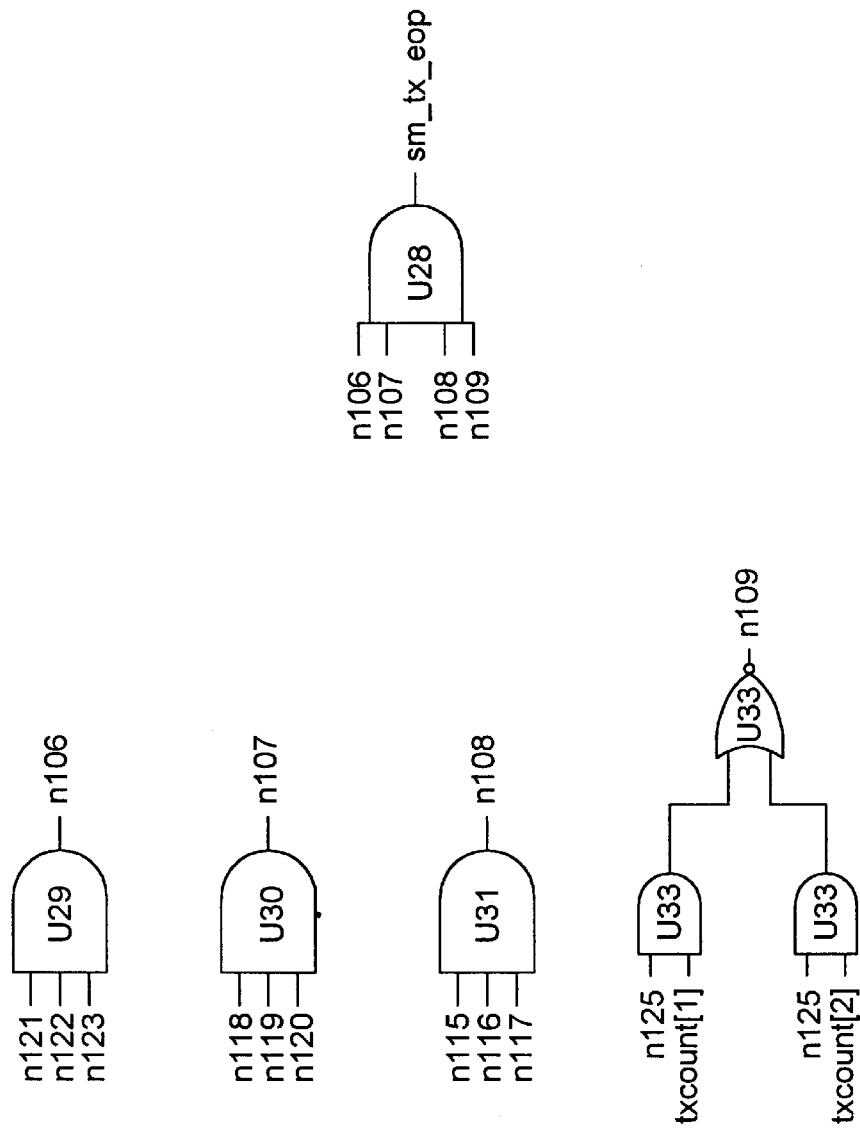
FIGS. 3A and 3B are collectively a portion of the gate logic of an example used to illustrate the operation of the method and system for improving a circuit design verification tool of FIGS. 1, 2A and 2B.
Figure 3B:
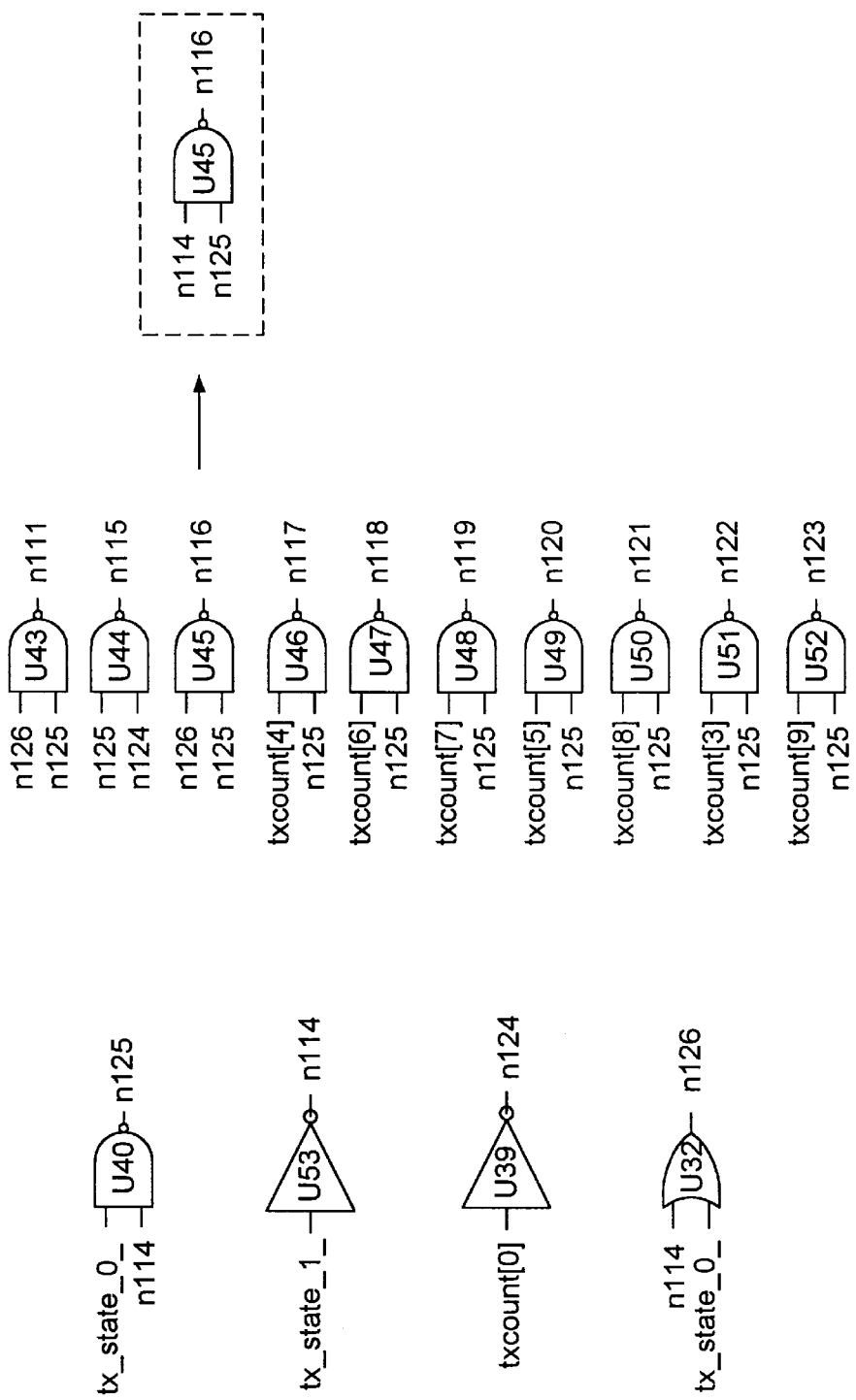

FIGS. 3A and 3B are collectively a portion of the gate logic of an example used to illustrate the results obtained through the operation of the method and system for improving the performance of a circuit design verification tool of FIGS. 1, 2A and 2B. Specifically, illustrated is the manner in which the original gate level netlist (sm_mem_pen) is revised to comply with the revised RTL netlist (patent_eco) of Appendix A.

The following discussion will refer to both the files in Appendix A and to the gate level implementation illustrated in FIGS. 3A and 3B. It is important to note that the gate level implementation described with respect to FIGS. 3A and 3B is only the portion of the code necessary to describe this particular example, the balance of the logic being omitted for clarity.

Referring now to FIG. 3A, since sm_tx_eop is generated by AND4HH (file sm_mem_pen in Appendix A, U28) and the inputs to this four input AND gate are n106, n107, n108 and n109, only when all four inputs are logic 1 will the output of this AND gate (U28) produce a logic 1. Signal n106 is the output of three input AND gate U29, in which all 3 inputs n121, n122 and n123 need to be logic 1 to make n106 equal to logic 1. Signal n107 is the output of 3 input AND gate U30, in which all three inputs n118, n119 and n120 need to be logic 1 to make n107 equal to logic 1. Similarly, signal n108 is the output of 3 input AND gate U31, in which all 3 inputs n115, n116 and n117 need to be logic 1 to make n108 equal to logic 1. Signal n109 is the output of combinational gate U33 (two two-input AND gates having the four inputs n125, txcount[1], n125 and txcount [2]. The output of the two AND gates of U33 are supplied to a two-input NOR gate, the output of which (n109) is the output of the combinational gate U33.

With reference now to FIG. 3B, note that the signal n125 forms an input to NAND gates U43 through U52. If signal n125 goes to a logic level 0, signals n115 through n123 will be logic 1, which will drive signals n106, n107 and n108 (FIG. 3A) to be logic 1, and simultaneously, signal n109 will be driven to logic 1. These four inputs of logic 1 (signals n106, n107, n108 and n109) will generate a logic 1 for the sm_tx_eop signal output of U28 (FIG. 3A).

Referring back to FIG. 3B, signal n125 is the output of two input NAND gate U40, in which both inputs tx_state_0_ and n114 (inverse of tx_state_1_ from U53) must be logic 1 to drive n125 to a logic level 0. As shown in the file patent_org in Appendix A, tx_state[1:0]=2'b01 alone will generate an sm_tx_eop=1 condition, which is exactly what the TX_EOP state will do in the original RTL. Note that in RTL code, the state name is tx_state[1:0], while in gate level the "[ ]" is replaced by "_", so that tx_state[0] in RTL becomes tx_state_0_, and tx_state[1] becomes tx_state_1_.

If n125 is logic 1 (means not in state TX_EOP from above analysis), txcount[9:3] (U46 through U52) will need to be logic 0 to drive signals n117 through n123 to be logic 1. This will drive two of four inputs of U28 (n106 and n107) to be logic 1. Signal n109 will be logic 1 (when n125=logic 1) only if txcount[2:1] are both logic 0 (from combinational gate U33). Signal n115 will be logic 1 if n124 is 0 which means txcount[0]=1 (U39). Signal n126=0 will drive n116=1, and signal n126=0 requires both signal n114 and tx_state_0_ (or tx_state[1:0]=2'b10 since n114 is inversion of tx_state_1_ (U53)).

These signals will drive the balance of the two inputs of four input AND gate U28 (signals n108 and n109) to be logic 1, hence driving sm_tx_eop to be logic 1. In summary, if txcount[9:0]=10'b0000000001 and tx_state[1:0]=2'b10, sm_tx_eop will be 1. This is exactly what the TX_BYTE2 state will do for sm_tx_eop in the original RTL. Any other condition will produce sm_tx_eop=0 in gate netlist which agrees with RTL netlist.

Now, if TX_BYTE3 is changed from sm_tx_eop=1'b0 to sm_tx_eop=tx_cnt_eq1, as per the required revision (see Appendix A, file patent_eco), then, in both the TX_BYTE2 state (tx_state[1:0]=10) and TX_BYTE3 state (tx state[1:0]=11) sm_tx_eop=tx_cnt_eq1 should be implemented.

The tx_state[1:0] can be 10 or 11 meaning that the tx_state[0] is a don't care. This illustrates that no matter the logic level of tx_state[0], the output will be a logic 1. This demonstrates a more relaxed condition than in the original RTL as the original RTL requires that tx_state[0] be 0.

From the above analysis, it can be seen that the OR2II (U32 as per file eco_gates in Appendix A) output n126 is equivalent to the tx_state[1:0]=10 condition which combines with txcount[9:0]=10'b0000000001 and will generate sm_tx_eop=tx_cnt_eq1.

For the revised RTL (Appendix A, file patent_eco), since tx_state[0] is don't care, tx_state[0] is removed from the original OR2II (U32 as per file eco_gates in Appendix A) equation, and tx_state[1] alone generates sm_tx_eop. In this manner, the ECO compile operation, as performed within the formal verification tool allows a circuit designer the ability to implement a change to an RTL level netlist and to generate a corresponding gate level netlist without performing an additional synthesis operation.

In this example, a complicating factor is that signal n126 is used elsewhere for other functions. It is not desirable to make those functions true in TX_BYTE3. In order to address this issue, the assignment of NAND2JJ U45 (.Q (n116), .A(n126), .B(n125)) (Appendix A, file eco_gates) is revised to NAND2JJ U45 (.Q(n116), .A(n114), .B(n125)), which only affects sm_tx_eop related logic.

The information relating to the first RTL netlist, first gate netlist and the revised RTL netlist is available in most formal verification tools. The above described process in the above example can be optimized by those tools to suggest a solution for users in changing a gate netlist to match an RTL revision.

Many variations and modifications may be made to the above-described embodiment(s) of the invention without departing substantially from the scope and principles of the invention. All such modifications and variations are intended to be included herein within the scope of the present invention.

HP Docket No.: 10981453

APPENDIX A patent_org

```
module sm_mem_pen ( clk50, nreset, tx_stop, sm_tx_dak, sm_tx_eop, txcount );

input       clk50, nreset, tx_stop, sm_tx_dak;
    input [9:0] txcount;
    output      sm_tx_eop;

parameter [1:0] TX_IDLE=4'h0,
                    TX_EOP=4'h1,
                    TX_BYTE2=4'h2,
                    TX_BYTE3=4'h3;

wire        nreset, sm_tx_dak, tx_stop, tx_cnt_eq1;
    wire  [9:0] txcount;

reg         tx_req, tx_ack, sm_tx_eop;
    reg   [1:0] tx_state, next_tx_state;

assign tx_cnt_eq1 = (txcount == 10'h001);

always @ (tx_stop or tx_ack or sm_tx_dak or tx_state or tx_cnt_eq1 )
    begin
        case (tx_state)
        TX_IDLE: begin
                tx_req = 1'b0;
                sm_tx_eop = 1'b0;
            end TX_EOP:begin
                sm_tx_eop = 1'b1;
                tx_req = 1'b0;
                if(sm_tx_dak | tx_stop)
                        next_tx_state = TX_IDLE;
                else
                        next_tx_state = TX_EOP;
            end TX_BYTE2:begin
                sm_tx_eop = tx_cnt_eq1;
                if(sm_tx_dak & !tx_stop)
                        next_tx_state = TX_BYTE3;
                else if (tx_stop)
```

HP Docket No.: 10981453

```
                    next_tx_state = TX_EOP;
            else
                    next_tx_state = TX_BYTE2;
        end TX_BYTE3:begin
            sm_tx_eop = 1'b0;
        end default:begin
            tx_req = 1'b0;
            sm_tx_eop = 1'b0;
            next_tx_state = TX_IDLE;
        end
        endcase
    end always @ (posedge clk50 or negedge nreset)
    if (~nreset)
        tx_state = TX_IDLE;
    else
        tx_state = next_tx_state;

endmodule
```

HP Docket No.: 10981453 sm_mem_pen

```
module sm_mem_pen ( clk50, nreset, tx_stop, sm_tx_dak, sm_tx_eop, \txcount[9] ,
    \txcount[8] , \txcount[7] , \txcount[6] , \txcount[5] , \txcount[4] ,
    \txcount[3] , \txcount[2] , \txcount[1] , \txcount[0]  );
  input clk50, nreset, tx_stop, sm_tx_dak, \txcount[9] , \txcount[8] ,
    \txcount[7] , \txcount[6] , \txcount[5] , \txcount[4] , \txcount[3] ,
    \txcount[2] , \txcount[1] , \txcount[0] ;
  output sm_tx_eop;
  wire tx_state_0_, next_tx_state_1_, next_tx_state_0_, tx_state_1_, n106,
    n107, n108, n109, n110, n111, n112, n113, n114, n115, n116, n117, n118,
    n119, n120, n121, n122, n123, n124, n125, n126, n127, n128, n129, n130;
  AND4HH U28 ( .Q(sm_tx_eop), .A(n108), .B(n107), .C(n106), .D(n109) );
  AND3JJ U29 ( .Q(n106), .A(n121), .B(n122), .C(n123) );
  AND3JJ U30 ( .Q(n107), .A(n118), .B(n119), .C(n120) );
  AND3JJ U31 ( .Q(n108), .A(n115), .B(n116), .C(n117) );
  OR2II U32 ( .Q(n126), .A(n114), .B(tx_state_0_) );
  AOI22GG U33 ( .Q(n109), .A(n125), .B(\txcount[1] ), .C(n125), .D(
    \txcount[2] ) );
  TLOW U34 ( .TLOW(n130) );
  NAND2GG U35 ( .Q(n127), .A(n110), .B(n111) );
  NAND3GG U36 ( .Q(n128), .A(n111), .B(tx_state_1_), .C(n112) );
  NOR2FF U37 ( .Q(n113), .A(tx_stop), .B(sm_tx_dak) );
  XOR2FF U38 ( .Q(n110), .A(tx_state_1_), .B(n113) );
  INVGG U39 ( .Q(n124), .A(\txcount[0] ) );
  NAND2GG U40 ( .Q(n125), .A(tx_state_0_), .B(n114) );
  INVGG U41 ( .Q(n112), .A(tx_stop) );
  INVHH U42 ( .Q(n129), .A(n111) );
  NAND2II U43 ( .Q(n111), .A(n126), .B(n125) );
  NAND2JJ U44 ( .Q(n115), .A(n125), .B(n124) );
  NAND2JJ U45 ( .Q(n116), .A(n126), .B(n125) );
  NAND2JJ U46 ( .Q(n117), .A(\txcount[4] ), .B(n125) );
  NAND2JJ U47 ( .Q(n118), .A(\txcount[6] ), .B(n125) );
  NAND2JJ U48 ( .Q(n119), .A(\txcount[7] ), .B(n125) );
  NAND2JJ U49 ( .Q(n120), .A(\txcount[5] ), .B(n125) );
  NAND2JJ U50 ( .Q(n121), .A(\txcount[8] ), .B(n125) );
  NAND2JJ U51 ( .Q(n122), .A(\txcount[3] ), .B(n125) );
  NAND2JJ U52 ( .Q(n123), .A(\txcount[9] ), .B(n125) );
  INVJJ U53 ( .Q(n114), .A(tx_state_1_) );
  UUSLSDPCQ0DD next_tx_state_reg_0_ ( .Q(next_tx_state_0_), .CLK(n130), .CN(
    n129), .D(n130), .PN(n127) );
  UUSLSDPCQ0DD next_tx_state_reg_1_ ( .Q(next_tx_state_1_), .CLK(n130), .CN(
    n129), .D(n130), .PN(n128) );
  UUSLSDCQ0DD tx_state_reg_1_ ( .Q(tx_state_1_), .CLK(clk50), .CN(nreset),
    .D(next_tx_state_1_) );
```

HP Docket No.: 10981453

UUSLSDCQ0DD tx_state_reg_0_ ( .Q(tx_state_0_), .CLK(clk50), .CN(nreset),
   .D(next_tx_state_0_) );
endmodule HP Docket No.: 10981453 patent_eco

```
module sm_mem_pen ( clk50, nreset, tx_stop, sm_tx_dak, sm_tx_eop, txcount );

5       input       clk50, nreset, tx_stop, sm_tx_dak;
        input [9:0] txcount;
        output      sm_tx_eop;

parameter [1:0] TX_IDLE=4'h0,
10                      TX_EOP=4'h1,
                        TX_BYTE2=4'h2,
                        TX_BYTE3=4'h3;

wire        nreset, sm_tx_dak, tx_stop, tx_cnt_eq1;
15      wire  [9:0] txcount;

reg         tx_req, tx_ack, sm_tx_eop;
        reg   [1:0] tx_state, next_tx_state;

20      assign tx_cnt_eq1 = (txcount == 10'h001);

always @ (tx_stop or tx_ack or sm_tx_dak or tx_state or tx_cnt_eq1 )
        begin
             case (tx_state)
25              TX_IDLE: begin
                     tx_req = 1'b0;
                     sm_tx_eop = 1'b0;
                end 30              TX_EOP:begin
                     sm_tx_eop = 1'b1;
                     tx_req = 1'b0;
                     if(sm_tx_dak | tx_stop)
                          next_tx_state = TX_IDLE;
35                   else
                          next_tx_state = TX_EOP;
                end TX_BYTE2:begin
40                   sm_tx_eop = tx_cnt_eq1;
                     if(sm_tx_dak & !tx_stop)
                          next_tx_state = TX_BYTE3;
                     else if (tx_stop)
                          next_tx_state = TX_EOP;
45                   else
```

23

```
                        next_tx_state = TX_BYTE2;
                end

TX_BYTE3:begin
                        sm_tx_eop = tx_cnt_eq1;
                end default:begin
                        tx_req = 1'b0;
                        sm_tx_eop = 1'b0;
                        next_tx_state = TX_IDLE;
                end
                endcase
        end always @ (posedge clk50 or negedge nreset)
        if (~nreset)
                tx_state = TX_IDLE;
        else
                tx_state = next_tx_state;

endmodule
``` eco_gates

```
    module sm_mem_pen ( clk50, nreset, tx_stop, sm_tx_dak, sm_tx_eop, \txcount[9] ,
        \txcount[8] , \txcount[7] , \txcount[6] , \txcount[5] , \txcount[4] ,
5       \txcount[3] , \txcount[2] , \txcount[1] , \txcount[0]  );
    input clk50, nreset, tx_stop, sm_tx_dak, \txcount[9] , \txcount[8] ,
        \txcount[7] , \txcount[6] , \txcount[5] , \txcount[4] , \txcount[3] ,
        \txcount[2] , \txcount[1] , \txcount[0] ;
    output sm_tx_eop;
10      wire tx_state_0_, next_tx_state_1_, next_tx_state_0_, tx_state_1_, n106,
            n107, n108, n109, n110, n111, n112, n113, n114, n115, n116, n117, n118,
            n119, n120, n121, n122, n123, n124, n125, n126, n127, n128, n129, n130;
        AND4HH U28 ( .Q(sm_tx_eop), .A(n108), .B(n107), .C(n106), .D(n109) );
        AND3JJ U29 ( .Q(n106), .A(n121), .B(n122), .C(n123) );
15      AND3JJ U30 ( .Q(n107), .A(n118), .B(n119), .C(n120) );
        AND3JJ U31 ( .Q(n108), .A(n115), .B(n116), .C(n117) );
        OR2II U32 ( .Q(n126), .A(n114), .B(tx_state_0_) );
        AOI22GG U33 ( .Q(n109), .A(n125), .B(\txcount[1] ), .C(n125), .D(
            \txcount[2] ) );
20      TLOW U34 ( .TLOW(n130) );
        NAND2GG U35 ( .Q(n127), .A(n110), .B(n111) );
        NAND3GG U36 ( .Q(n128), .A(n111), .B(tx_state_1_), .C(n112) );
        NOR2FF U37 ( .Q(n113), .A(tx_stop), .B(sm_tx_dak) );
        XOR2FF U38 ( .Q(n110), .A(tx_state_1_), .B(n113) );
25      INVGG U39 ( .Q(n124), .A(\txcount[0] ) );
        NAND2GG U40 ( .Q(n125), .A(tx_state_0_), .B(n114) );
        INVGG U41 ( .Q(n112), .A(tx_stop) );
        INVHH U42 ( .Q(n129), .A(n111) );
        NAND2II U43 ( .Q(n111), .A(n126), .B(n125) );
30      NAND2JJ U44 ( .Q(n115), .A(n125), .B(n124) );
    //  NAND2JJ U45 ( .Q(n116), .A(n126), .B(n125) );
        NAND2JJ U45 ( .Q(n116), .A(n114), .B(n125) );
        NAND2JJ U46 ( .Q(n117), .A(\txcount[4] ), .B(n125) );
        NAND2JJ U47 ( .Q(n118), .A(\txcount[6] ), .B(n125) );
35      NAND2JJ U48 ( .Q(n119), .A(\txcount[7] ), .B(n125) );
        NAND2JJ U49 ( .Q(n120), .A(\txcount[5] ), .B(n125) );
        NAND2JJ U50 ( .Q(n121), .A(\txcount[8] ), .B(n125) );
        NAND2JJ U51 ( .Q(n122), .A(\txcount[3] ), .B(n125) );
        NAND2JJ U52 ( .Q(n123), .A(\txcount[9] ), .B(n125) );
40      INVJJ U53 ( .Q(n114), .A(tx_state_1_) );
        UUSLSDPCQ0DD next_tx_state_reg_0_ ( .Q(next_tx_state_0_), .CLK(n130), .CN(
            n129), .D(n130), .PN(n127) );
        UUSLSDPCQ0DD next_tx_state_reg_1_ ( .Q(next_tx_state_1_), .CLK(n130), .CN(
            n129), .D(n130), .PN(n128) );
45      UUSLSDCQ0DD tx_state_reg_1_ ( .Q(tx_state_1_), .CLK(clk50), .CN(nreset),
```

```
     .D(next_tx_state_1_) );
   UUSLSDCQ0DD tx_state_reg_0_ ( .Q(tx_state_0_), .CLK(clk50), .CN(nreset),
     .D(next_tx_state_0_) );
endmodule
```

Therefore, having thus described the invention, at least the following is claimed:

1. A method for improving a circuit design verification tool by integrating the operations of design comparison and design revision, comprising the steps of:

generating a first high level circuit design program code;

generating a first logic level circuit design code;

comparing said first high level circuit design program code to said first logic level circuit design code, using a design verification tool, in order to determine whether said first logic level circuit design code is an accurate representation of said first high level circuit design program code;

generating a revised high level circuit design program code; and compiling, in said design verification tool, said revised high level circuit design program code in order to develop a revised logic level circuit design code.

2. The method of claim 1, wherein said first high level circuit design program code comprises a register transfer language (RTL) netlist.

3. The method of claim 1, wherein said first logic level circuit design code comprises a gate level netlist.

4. A system for improving a circuit design verification tool, comprising:

a first high level circuit design program code;

a first logic level circuit design code;

means for comparing said first high level circuit design program code to said first logic level circuit design code in order to determine whether said first logic level circuit design code is an accurate representation of said first high level circuit design program code; and means for compiling, using said comparing means, a revised high level circuit design program code in order to develop a revised logic level circuit design code.

5. The system of claim 4, wherein said first high level circuit design program code comprises a register transfer language (RTL) netlist.

6. The system of claim 4, wherein said first logic level circuit design code comprises a gate level netlist.

7. A method for improving a circuit design verification tool comprising the steps of:

integrating the operations of design comparison and design revision by performing an engineering change order (ECO) compile function as part of a formal design verification operation.

* * * * *